United States Patent [19] [11] 4,095,187
Yoshida [45] June 13, 1978

[54] DEMODULATION SYSTEM FOR A MULTI-LEVEL MULTI-PHASE SUPERPOSITION-MODULATED CARRIER WAVE

[75] Inventor: Yasuharu Yoshida, Tokyo, Japan

[73] Assignee: Nippon Electric Co., Ltd., Tokyo, Japan

[21] Appl. No.: 779,853

[22] Filed: Mar. 21, 1977

[30] Foreign Application Priority Data

Mar. 22, 1976 Japan ................................ 51-31022

[51] Int. Cl.² ............................................. H03D 3/20
[52] U.S. Cl. ..................................... 329/50; 325/346;
325/349; 329/105; 329/112; 329/122; 329/135
[58] Field of Search ................. 329/50, 104, 105, 112,
329/122, 124–126, 135; 325/346, 349

[56] References Cited

U.S. PATENT DOCUMENTS 4,039,961   8/1977   Ishio et al. ............................ 329/50

Primary Examiner—Siegfried H. Grimm
Attorney, Agent, or Firm—Sughrue, Rothwell, Mion, Zinn and Macpeak

[57] ABSTRACT

A demodulation system for demodulating a multi-level, multi-phase, superposition-modulated carrier wave is disclosed. The demodulation system includes a phase-detecting circuit and first and second demodulator circuits. The first demodulator circuit discriminates the output of the phase-detecting circuit to reproduce a first demodulated signal. The second demodulator circuit squares the output of the phase-detecting circuit and discriminates the squared output with respect to a given level. The resulting signal is then combined with the output of the first demodulator circuit in Exclusive-OR logic to obtain a second demodulated signal.

3 Claims, 6 Drawing Figures

DEMODULATION SYSTEM FOR A MULTI-LEVEL MULTI-PHASE SUPERPOSITION-MODULATED CARRIER WAVE

CROSS-REFERENCE TO RELATED APPLICATON

The subject matter of this application is related to my co-pending application Ser. No. 779,878, filed Mar. 21, 1977.

BACKGROUND OF THE INVENTION

The present invention relates in general to a demodulation system for a multi-level, multi-phase, superposition-modulated carrier wave, and more particularly to a demodulation system of a simple construction for demodulating a multi-level, multi-phase, superposition-modulated carrier wave that is formed by synthesizing two phase-modulated waves mutually synchronized.

Now that digital transmission has been in practical use, efforts have been made recently to enhance the transmission capacity of a carrier wave and the efficiency of the use of frequency bands. One of the proposals made as a result of such efforts is the multi-level, multi-phase, superposition-modulated signal transmission system in which a first and a second modulated carrier waves are synthesized under synchronized state to constitute a composite carrier wave for transmission. An ordinary multi-level, multi-phase, superposition-demodulator apparatus for such transmission system includes the so-called re-modulation type demodulator synchronized with the incoming transmitted carrier wave, and a vector subtractor coupled to the demodulator.

The demodulator is adopted to demodulate at its first demodulator section the first modulated carrier wave contained in the modulated carrier wave. Also, the second modulated carrier wave is obtained by deriving the remodulated first modulated carrier wave from the first modulator section and subjecting it to vector subtraction. This second modulated carrier wave is demodulated at the second demodulator section similar to the first demodulator circuit.

This demodulation system in the prior art has a disadvantage that it necessitates the first and second demodulator circuits and the vector subtractor circuit to obtain the second demodulated carrier waves, complicating the circuit construction. In addition, it is very difficult to obtain a stable modulated carrier wave from a vector subtractor circuit. Furthermore, in the first demodulator circuit it is necessary to obtain a first modulated carrier wave besides the first demodulated signal, so that a re-modulation type phase synchronizer circuit that is simple in construction must be employed. Accordingly, there is a restriction to the circuit construction.

SUMMARY OF THE INVENTION

It is therefore an object of the present invention to provide a demodulation system of simple construction in which the above-mentioned disadvantages are eliminated.

According to one feature of the present invention, there is provided a demodulation system for demodulating a multi-level, multi-phase, superposition-modulated carrier wave formed by synthesizing first and second phase-modulated carrier waves whose carrier waves are mutually synchronized to reproduce first and second demodulated signals, comprising a phase-detector circuit for detecting the superposition-modulated carrier wave, a first demodulator circuit for discriminating the output of the phase-detector circuit to reproduce the first demodulated signal, and a second demodulator circuit including squaring means for squaring the output of the phase-detector circuit, discriminator-shaper means for discriminating the output of the squaring means with respect to a given level, and logic means for obtaining an Exclusive-OR function of the output of the first demodulator circuit and the output of the discriminator-shaper means, whereby said second demodulated signal can be reproduced.

Now the present invention will be described in more detail with reference to the accompanying drawings, in which.

DETAILED DESCRIPTION OF THE DRAWINGS

Figure 1:
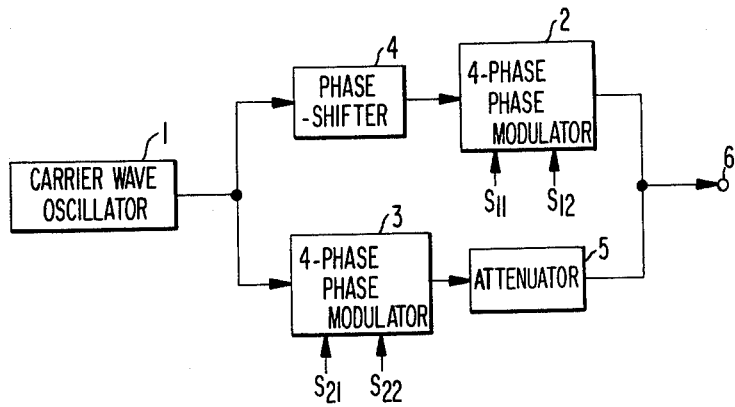
FIG. 1 is a block diagram of one example of a known modulator for a 16-level superposition-modulation transmission system in the prior art.
Figure 2:
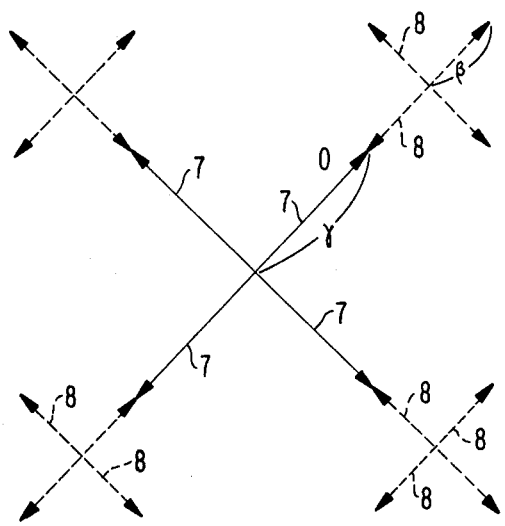
FIG. 2 is a vector diagram for the modulator shown in FIG. 1.

Referring now to the drawings, of parallel connection type of modulator apparatus in a 16-level superposition-modulation system in the prior art is shown in a block form in FIG. 1, in which reference numeral 1 designates a carrier wave oscillator; 2, a first 4-phase phase-modulator; 3, a second 4phase phase-modulator; 4, a phase-shifter; 5, an attenuator; and 6, an output terminal. In the phase-modulator 2, a carrier wave is modulated by first digital signals $S_{11}$ and $S_{12}$ of 2 series, the resultant signal being called a first modulated signal or a first modulated wave hereunder, and a signal obtained by demodulating this signal is called a first demodulated signal. Likewise, in the phase-modulator 3 a carrier wave is modulated by second digital signals $S_{21}$ and $S_{22}$ of 2 series, the resultant signal being called a second modulated signal or a second modulated wave hereunder, and a signal obtained by demodulating this signal is called a second demodulated signal. The phase-shifter 4 serves to adjust the phase relationship between the first and second modulated signals. It is assumed here that they are adjusted into an in-phase relationship. The attenuator 5 serves to adjust the level difference between the first and second modulated signals, and here the first modulated signal level is represented by $\gamma$, while the second modulated signal level is represented by $\beta$ (See FIG. 2). If $\gamma$ is equal to $2\beta$, the modulation is called a well-known 16-level quadrature amplitude modulation (QAM). A vector diagram of the modulation vector at the output terminal 6 (FIG. 1) is shown in FIG. 2. Reference numeral 7 designates a vector representing the first modulated signal, numeral 8 designates a vector representing the second modulated signal, and a combined vector of these vectors appears at the output terminal 6.

Figure 3:
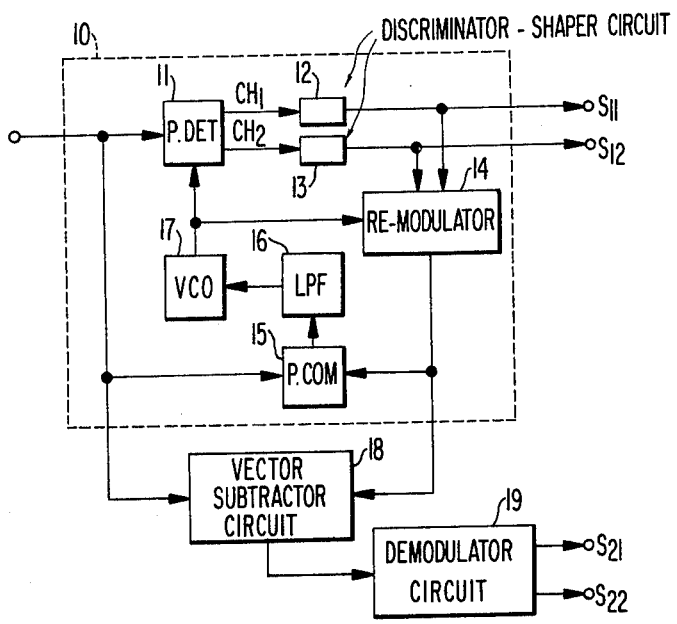
FIG. 3 is a block diagram of one example of the demodulation system in the prior art.

A known demodulation system for demodulating such a superposition-modulated signal is illustrated in FIG. 3. In this figure, numeral 10 designates a 4-phase demodulator circuit employing a well-known re-modulation type phase synchronizer circuit; 18, a vector subtractor circuit; and 19, a demodulator circuit similar to the demodulator circuit 10. The demodulator circuit 10 comprises a 4-phase phase-detector (P. DET) 11, discriminator-shaper circuit (or code regenerator) 12 and 13, a re-modulator 14, a phase comparator (P. COM) 15, a low-pass filter (LPF) 16 and a voltage-controlled oscillator (VCO) 17. Since the operation of this modulation system is well-known, it will be described only briefly. In the discriminator-shaper circuits 12 and 13, the first demodulated signals $S_{11}$ and $S_{12}$ are discriminated and reproduced. On the other hand, the second demodulated signals are obtained in the following manner. The input superposition-modulated signal is branched, and the output signal of the re-modulator circuit 14 is subtracted from the branched signal in the vector subtractor circuit 18. (A directional coupler can be used in this combination.) More particularly, since the first modulated wave is appearing at the output of the re-modulator circuit 14, the output of the vector subtractor circuit contains only the second modulated signal. If this second modulated signal is demodulated in the 4-phase demodulator circuit 19, then the second demodulated signals $S_{21}$ and $S_{22}$ can be obtained.

However, such a conventional demodulation system has the following disadvantages. That is, for the purpose of obtaining the first and second demodulated signals, two 4-phase phase-demodulator circuits 10 and 19 and a vector subtractor circuit 18 are required, and thus the circuit construction becomes complex. In addition, since the operation of subtracting the output of the re-modulator 14 from the superposition-modulated wave for obtaining the first modulated wave is carried out in the RF band, in order to obtain a stable characteristic of the output of the vector subtractor circuit 18, the two input signals must be stable with respect to both the amplitude and the phase. Furthermore, the system for obtaining the output signal of the re-modulator 14 must be constructed in a considerably complex manner, so that it is very difficult to obtain a substantially stable signal. Still further, since the phase synchronizer circuit employed in the 4-phase phase-demodulator circuit 10 is required to obtain, in addition to the first demodulated signal, the first modulated signal serving as an input signal to the vector subtractor circuit 18, it must be a re-modulation type phase synchronizer circuit having a simple circuit construction, and so, it is restricted with respect to circuit construction. Of course, if one 4-phase-modulator is additionally provided, then any phase synchronizer circuit such as a frequency-multiplier system, etc., can be employed.

Figure 4:
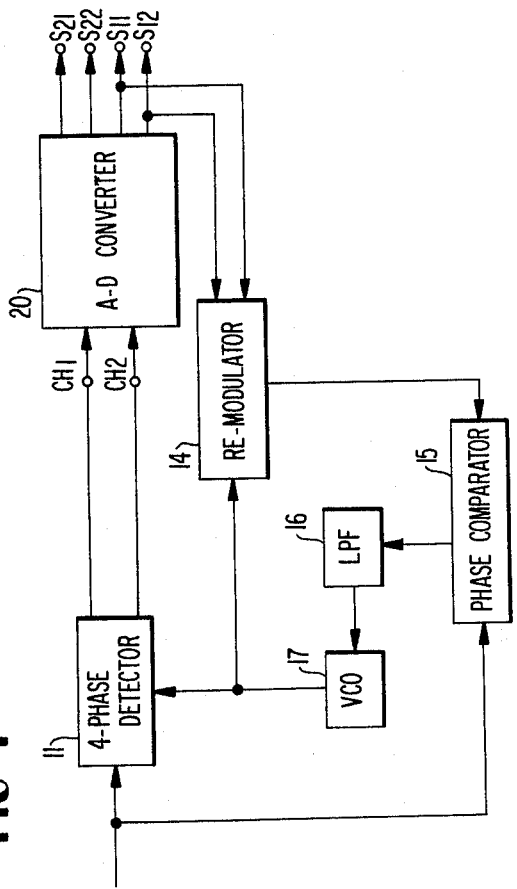
FIG. 4 is a block diagram of one preferred embodiment of the demodulation system according to the present invention.

One preferred embodiment of the 4-phase demodulation system according to the present invention is illustrated in a block form in FIG. 4. In this figure, reference numerals 11 and 14 to 17 designate the same circuit components as those represented by like reference numerals in FIG. 3. Reference numeral 20 designates an A-D converter circuit for obtaining first demodulated signals and second demodulated signals. A more detailed circuit arrangement of this A-D converter circuit 20 is shown in FIG. 5.

Figure 6:
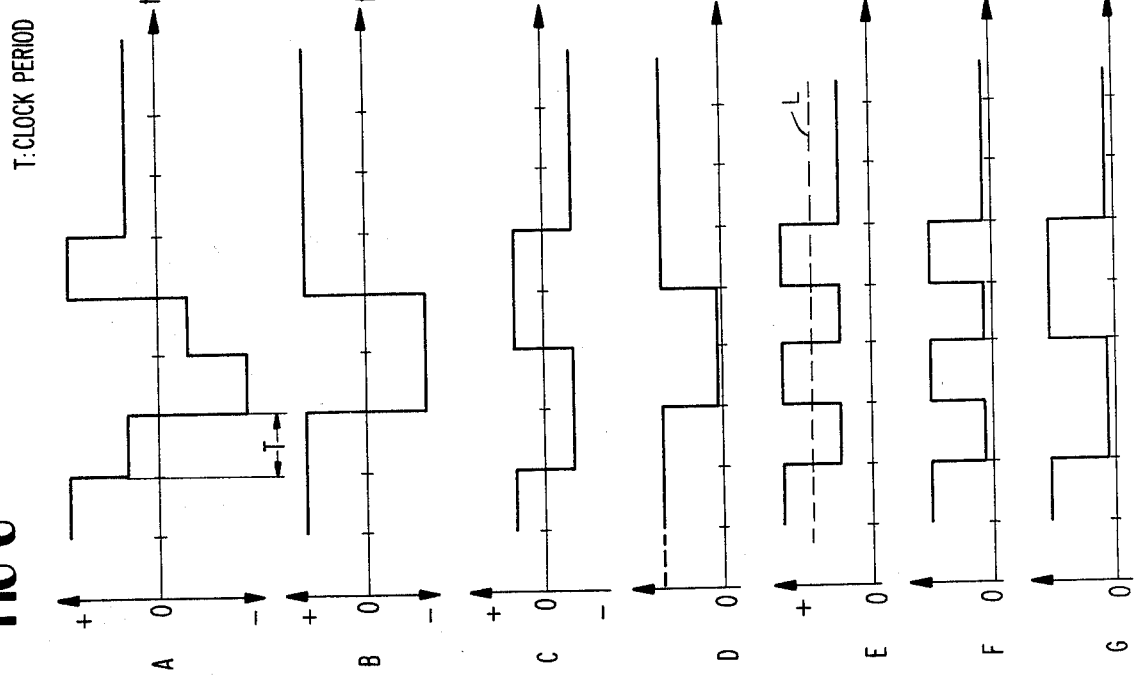
FIG. 6 is a waveform diagram showing examples of the waveforms at various points of the circuit shown in FIG. 5.
Figure 5:
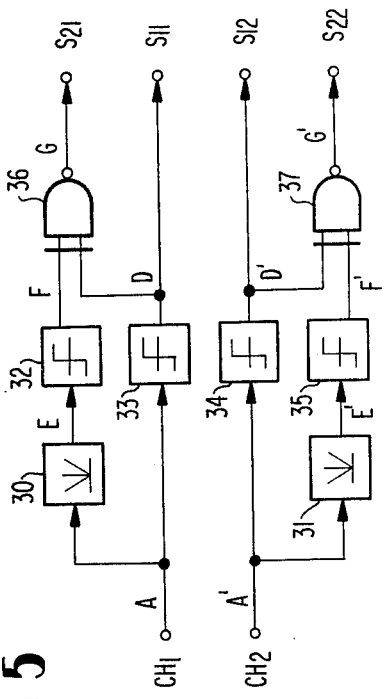
FIG. 5 is one example of an A-D converter circuit included in the demodulation system in FIG. 4.

With reference to FIG. 5, reference numerals 30 and 31 designate full wave rectifier circuits or squaring circuits (absolute value circuits); 32 to 35, discriminator-shaper circuits, and 36 and 37, Exclusive-OR circuits. Operation of this circuit will be explained hereunder with reference to FIG. 6. The output signal from the 4-phase detector circuit 11 in FIG. 4 is a signal obtained by demodulating a modulated signal in a superposed form consisting of a first modulated signal and a second modulated signal, and it -phase phase-modulator a 4-level demodulated signal. Assuming that the demodulated signal in the channel $CH_1$ consists of the pattern series such as waveform A, then the demodulated signal is the superposed waveform consisting of the first demodulated signal as represented by waveform B and the second demodulated signal as represented by waveform C. Therefore, it is only necessary to separate these waveforms from each other by any suitable means. At first, if the waveform A is discriminated with respect to the 0-level of voltage, then waveform D can be obtained, and this conforms with the waveform B, whereby the first demodulated signal $S_{11}$ can be obtained. In addition, if the waveform A is full-wave rectified by the full-wave rectifier 30, then waveform E can be obtained. Subsequently, if the waveform E is discriminated with respect to the L-level of voltage, then waveform F can be obtained. Reviewing here the waveform F, which contains the second demodulated signal component, the polarity of waveform F is complementary to the second demodulated signal $S_{21}$ when the first demodulated signal is at a negative level (or 0-level). Therefore, if the Exclusive-OR function of the waveform F and the waveform D is obtained in the Exclusive-OR circuit 36, then the output waveform G can be obtained. This waveform G conforms with the waveform C, and serves as the second demodulated signal $S_{21}$. Through the aforementioned operations, the first demodulated signal and the second demodulated signal can be obtained. Likewise, with respect to the other channel $CH_2$, operations similar to those described above are effected. In the above-mentioned way, the first demodulated signals $S_{11}$ and $S_{12}$ and the second demodulated signals $S_{21}$ and $S_{22}$ can be obtained.

As described above, the demodulation system according to the present invention has a great effect and advantage that the system can be constructed of very simple circuits.

While the present invention has been described above in connection with the demodulation system of the re-modulation comparison type phase synchronizer circuit, the present invention is applicable not only to frequency-multiplier system and the like, but also generally to multi-level, multi-phase, superposition-demodulation systems.

What is claimed is:

1. A demodulation system for demodulating into first and second demodulated signals a multi-level, multi-phase, superposition-modulated carrier wave formed by combining first and second phase-modulated carrier waves synchronized with each other, comprising
   an oscillator of a frequency controllable in response to a control signal,
   a phase-detector circuit for detecting said superposition-modulated carrier wave with the output of said oscillator serving as a phase reference,
   means for processing at least the output of said phase-detector circuit to produce said control signal,
   a first demodulator circuit for discriminating the output of said phase-detector circuit to reproduce said first demodulated signal, and a second demodulator circuit including squaring means for squaring the output of said phase-detector circuit, discriminator-shaper means for discriminating the output of said squaring means with respect to a given level, and logic means for obtaining the Exclusive-OR function of the output of said first demodulator circuit and the output of said discriminator-shaper means, whereby said second demodulated signal is reproduced.

2. A demodulation system as recited in claim 1 wherein said modulated carrier wave is a quadrature amplitude modulated carrier wave and said phase-detector circuit is a 4-phase phase detector.

3. A demodulation system as recited in claim 2 wherein said 4-phase phase detector provides first and second channel outputs, said first demodulator including first and second discriminator-shaper circuits connected to said first and second channel outputs, respectively, and producing first demodulated signals, and said second demodulator including first and second squaring circuits connected to said first and second channel outputs, respectively, third and fourth discriminator-shaper circuits connected to said first and second squaring circuits, respectively, and first and second Exclusive-OR circuits connected to said first and third discriminator-shaper circuits and to said second and fourth discriminator-shaper circuits, said first and second Exclusive-OR circuits producing second demodulated signals.

* * * * *

UNITED STATES PATENT AND TRADEMARK OFFICE
CERTIFICATE OF CORRECTION

PATENT NO. : 4,095,187
DATED : June 13, 1978
INVENTOR(S) : Yasuharu YOSHIDA

It is certified that error appears in the above-identified patent and that said Letters Patent are hereby corrected as shown below:

Column 2, line 35 - delete "of" insert -- a -- line 40 - delete "4phase" insert -- 4-phase --

Column 4, line 7 - delete "-phase phase-modulator" insert -- is --

Signed and Sealed this

*Twenty-third* Day of *January 1979*

[SEAL]

*Attest:*

RUTH C. MASON
*Attesting Officer*

DONALD W. BANNER
*Commissioner of Patents and Trademarks*